US007003262B2

(12) United States Patent
Fukui

(10) Patent No.: US 7,003,262 B2
(45) Date of Patent: Feb. 21, 2006

(54) METHOD AND DEVICE FOR DETERMINING SIDEBAND RATIO OF SUPERCONDUCTION MIXER USING COMB GENERATOR

(75) Inventor: Yasuo Fukui, Aichi (JP)

(73) Assignee: Japan Science and Technology Agency, Kawaguchi (JP)

( * ) Notice: Subject to any disclaimer, the term of this patent is extended or adjusted under 35 U.S.C. 154(b) by 225 days.

(21) Appl. No.: 10/480,840

(22) PCT Filed: May 17, 2002

(86) PCT No.: PCT/JP02/04770

§ 371 (c)(1),
(2), (4) Date: Dec. 15, 2003

(87) PCT Pub. No.: WO03/016928

PCT Pub. Date: Feb. 27, 2003

(65) Prior Publication Data

US 2004/0185802 A1    Sep. 23, 2004

(30) Foreign Application Priority Data

Aug. 20, 2001 (JP) ............................. 2001-248800

(51) Int. Cl.
*H04B 1/68* (2006.01)
*H04B 17/00* (2006.01)
(52) U.S. Cl. .................... 455/47; 455/203; 455/226.4; 324/76.41
(58) Field of Classification Search ............ 455/115.1, 455/115.3, 115.4, 47, 109, 203, 226.1, 226.2, 455/226.3, 226.4, 313, 323, 333, 67.11, 67.7; 324/76.19, 76.41
See application file for complete search history.

(56) References Cited

U.S. PATENT DOCUMENTS 3,644,846 A * 2/1972 Bridges et al. ............. 359/299

FOREIGN PATENT DOCUMENTS

| JP | 359194543 A | * 11/1984 |
| JP | 2002-162659 | 6/2002 |

OTHER PUBLICATIONS

Burke, P.J. et al., Length scaling of bandwidth and noise in hot-electron superconducting mixers Appl. Phys. Lett. vol. 68, No. 23, 1996, pp. 3344 to 3346.

* cited by examiner

*Primary Examiner*—Nguyen T. Vo
(74) *Attorney, Agent, or Firm*—Oblon, Spivak, McClelland, Maier & Neustadt, P.C.

(57) ABSTRACT

The present invention provides a method and device for determining the sideband ratio of a superconducting mixer using a comb generator. The method includes the steps of: (a) tentatively adjusting the sideband ratio of a mixer for calibration of an output of the comb generator; (b) determining the signal intensity of a pseudo-celestial signal oscillator for calibration of the output of the comb generator; (c) repeating the steps (a) and (b) to derive the relation between the sideband radio of the mixer for the comb-generator output calibration and the intensity of a pseudo-celestial signal; (d) calibrating the output of the comb generator; and (e) obtaining the sideband ratio of the mixer to be measured.

8 Claims, 3 Drawing Sheets

F I G. 3
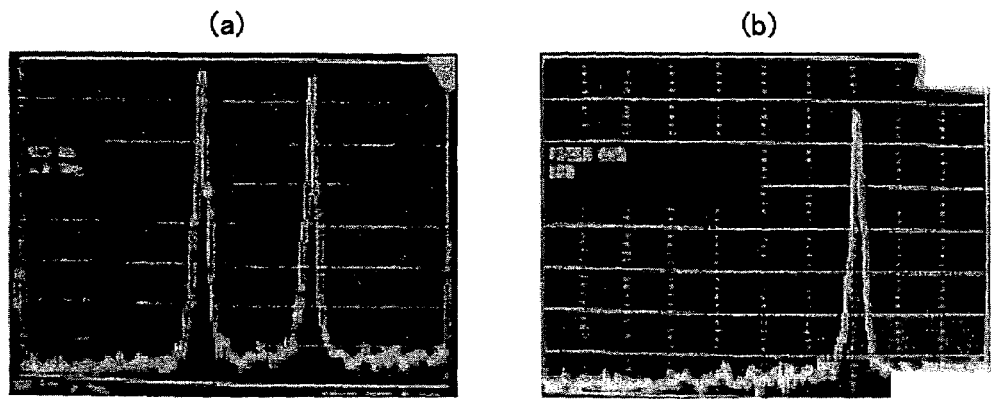
F I G. 4
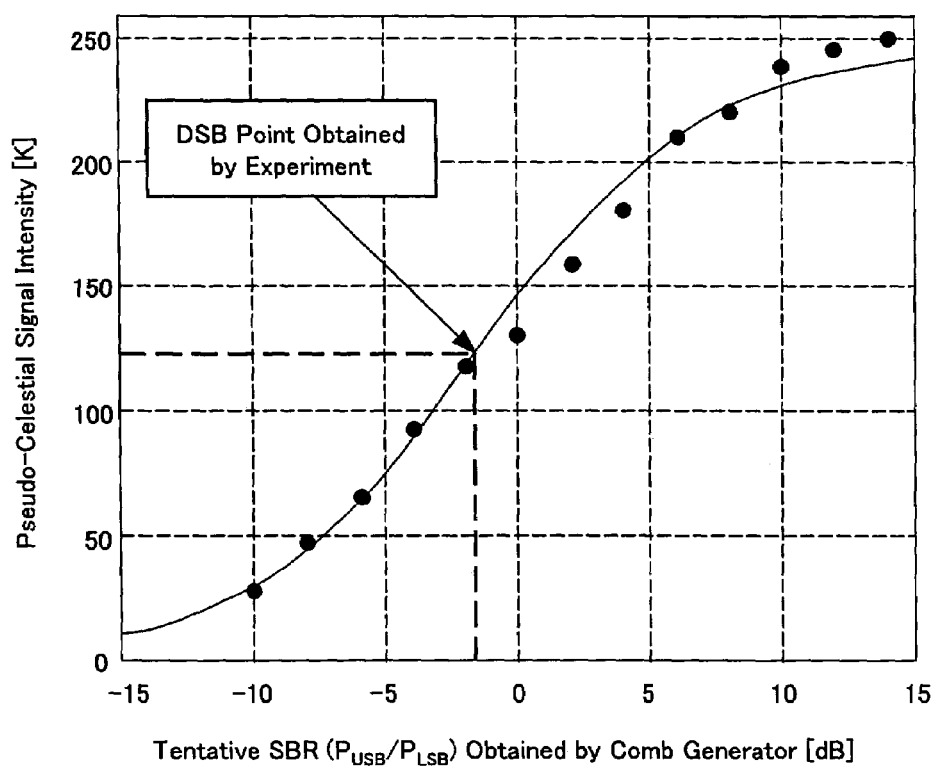

METHOD AND DEVICE FOR
DETERMINING SIDEBAND RATIO OF
SUPERCONDUCTION MIXER USING COMB
GENERATOR

TECHNICAL FIELD

The present invention relates to a method and device for determining the sideband ratios (SBR) of superconductor-insulator-superconductor (SIS) mixers using a comb generator.

BACKGROUND ART

Millimeter-wave and submillimeter-wave bands are important for radio astronomy and the measurement of molecules in the atmosphere. The improvement of a superconducting (SIS) mixer operating in these bands has been actively studied in astronomical observatories at many sites around the world, for example, in the National Astronomical Observatory of Japan, the National Astronomy Observatory of the U.S., and the German and French radio astronomy observatories.

Among signal detection technologies in the millimeter-wave and submillimeter-wave bands, the heterodyne method is the most popular method at present. In such a heterodyne system, the usage of efficiencies of upper and lower sidebands is closely related to the properties of the radio waves to be detected. In other words, the usage differs remarkably depending on whether the frequency characteristics of a radio wave source to be measured represent a continuous spectrum or a line spectrum. In the case of the continuous spectrum, a double-sideband receiver operates with higher efficiency. In the case of the line spectrum, a single sideband receiver is preferably used.

In ground measurement, a receiver receives radiated components released in the atmosphere as noise. Accordingly, extra caution is required in line spectrum observation using the double-sideband receiver. The reason is that spectra of the air are not always uniform and oxygen and water molecules give high noise temperatures to the spectra of the molecules to be determined.

In the millimeter-wave and submillimeter-wave bands where the spectra of many molecules are concentrated, it is worldwide common sense that a superconducting (SIS) receiver is generally used as the most sensitive receiver. SIS mixers are being developed in order to realize observation using the SIS mixers in a wider band (a 30% to 40% wider band: the band is determined by waveguides).

DISCLOSURE OF INVENTION

The sideband ratios of these mixers are not always obviously determined. The reason is as follows: SIS mixers originally had a large capacitance component. In order to cancel out this component, various devices have been considered because the devices have frequency characteristics.

Necessarily, therefore, a uniform sideband ratio cannot be obtained in the frequency band. In observation, a noise temperature fluctuates in proportion to the sideband ratio. In the case of the line spectrum, the apparent intensity thereof varies. Therefore, it is very important for the accurate measurement of radio field intensity to know the sideband ratio. However, a full-scale device for obtaining the sideband ratio has not been developed.

The sideband ratio (SBR) of the superconducting mixer is defined by the ratio of an upper-sideband gain ($G_{USB}$: the ratio of an output signal intensity $P_{out.USB}$ and an input signal intensity $P_{in.USB}$) and a lower-sideband gain ($G_{LSB}$: the ratio of an output signal intensity $P_{out.LSB}$ and an input signal intensity $P_{in.LSB}$).

When signals are injected into the upper and lower sidebands and the ratio of input signal intensities ($P_{in.USB}/P_{in.LSB}$) and the ratio of output signal intensities ($P_{out.USB}/P_{out.LSB}$) can be measured, the sideband ratio (SBR) can be obtained.

However, whereas it is relatively easy to accurately obtain the ratio of output signal intensities ($P_{out.USB}/P_{out.LSB}$), it is difficult to accurately obtain the ratio of input signal intensities ($P_{in.USB}/P_{in.LSB}$). Therefore, it is difficult to determine the sideband ratio (SBR).

In consideration of the above situation, it is an object of the present invention to provide a method and device for determining the sideband ratio of a superconducting mixer using a comb generator, the method and device realizing the accurate determination of the sideband ratio to detect millimeter waves and submillimeter waves in a wider band with high sensitivity.

To accomplish the above object, the present invention provides:

[1] A method for determining the sideband ratio of a superconducting mixer using a comb generator, the method including the steps of: (a) tentatively adjusting the sideband ratio of a mixer for calibration of an output of the comb generator; (b) determining the signal intensity of a pseudo-celestial signal oscillator for calibration of the output of the comb generator; (c) repeating the steps (a) and (b) to derive the relation between the sideband radio of the mixer for the comb-generator output calibration and the intensity of the pseudo-celestial signal; (d) calibrating the output of the comb generator; and (e) obtaining the sideband ratio of the mixer to be measured.

[2] In the method disclosed in [1], preferably, the output of the comb generator is calibrated using a variable sideband mixer with a back short.

[3] In the method disclosed in [1], preferably, the frequency of a reference signal oscillator for the comb generator is swept to obtain the frequency characteristics of the sideband ratio in a frequency band.

[4] A device for determining the sideband ratio of a superconducting mixer using a comb generator, the device including: a signal oscillation unit having a comb-generator reference signal oscillator, the comb generator, a pseudo-celestial signal oscillator for calibration of an output of the comb generator, and a local oscillator; a Dewar vessel having superconducting mixers to be measured and a superconducting mixer for calibration of the output of the comb generator; a temperature calibration unit; a spectrum analyzer connected to an output section of the Dewar vessel; and an electronic controller connected to the signal oscillation unit, the Dewar vessel, the temperature calibration unit, and the spectrum analyzer, wherein an output signal of the comb generator is supplied to the Dewar vessel to obtain the sideband ratio of each superconducting mixer to be measured.

[5] In the device disclosed in [4], preferably, the comb-generator reference signal oscillator generates a signal with a bandwidth of several GHz.

[6] In the device disclosed in [4], preferably, the frequency of the comb-generator reference signal oscillator is swept to obtain the frequency characteristics of the sideband ratio in a frequency band.

[7] In the device disclosed in [4], preferably, the temperature calibration unit has a room-temperature load, a cold load, and a rotary mirror controlled through the electronic controller.

[8] In the device disclosed in [7], preferably, with respect to noise temperature, current-voltage characteristics, and IF band characteristics, the rotary mirror, controlled through the electronic controller, is rotated to automatically measure the room-temperature and cold loads, thus calibrating the temperature.

BRIEF DESCRIPTION OF THE DRAWINGS

FIG. 3 includes graphs, related to the embodiment of the present invention, showing measurements of the sideband ratios.

FIG. 4 is a graph, related to the embodiment of the present invention, showing the relation between a tentative SBR, obtained through the comb generator when the back short of a superconducting (SIS) mixer for calibration of an output of the comb generator is changed, and the intensity of a pseudo-celestial signal.

BEST MODE FOR CARRYING OUT THE INVENTION

An embodiment of the present invention will now be described in detail.

Figure 1:
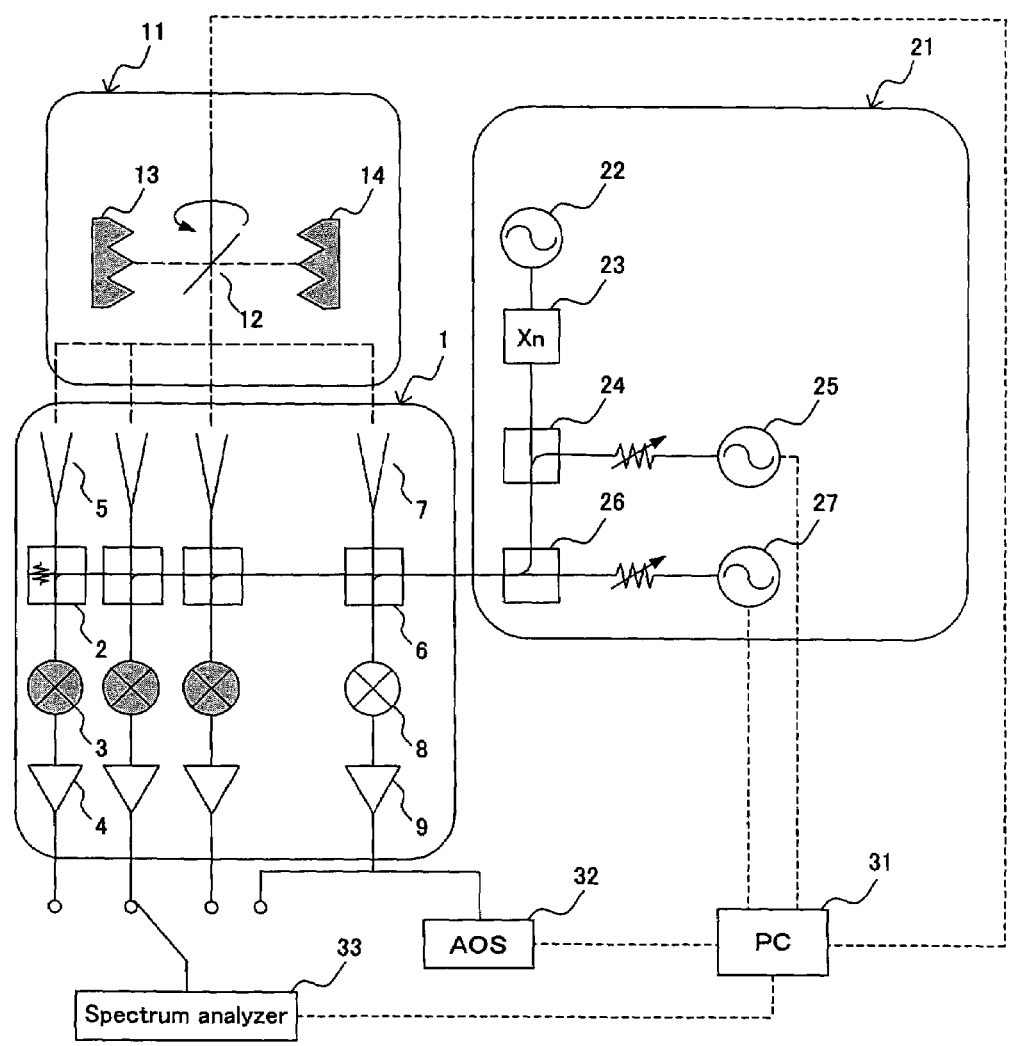
FIG. 1 is a block diagram of a device, embodying the present invention, for determining the sideband ratio (SBR) of a superconducting (SIS) mixer using a comb generator.

FIG. 1 is a block diagram of a device, embodying the present invention, for determining the sideband ratio (SBR) of a superconducting (SIS) mixer using a comb generator.

Referring to FIG. 1, reference numeral 1 denotes a Dewar vessel (4K cryostat); 2 and 6 denote CGCs (cross guide couplers); 3 denotes superconducting (SIS) mixers to be measured; 4 and 9 denote HEMT amplifiers; 5 and 7 denote horns; 8 denotes a superconducting (SIS) mixer (with a back short), the mixer being used for calibration of an output of a comb generator; 11 denotes a temperature calibration unit; 12 denotes a rotary mirror; 13 denotes a room-temperature load (300 K); 14 denotes a liquid nitrogen cold load (77 K); 21 denotes a signal oscillation unit; 22 denotes a comb-generator reference signal oscillator (several GHz); 23 denotes a comb generator; 24 and 26 denote directional couplers; 25 denotes a pseudo-celestial signal oscillator for calibration of the output of the comb generator; 27 denotes a GUNN oscillator for LO (local oscillation); 31 denotes a computer (an electronic controller); 32 denotes an AOS (acousto-optic spectrometer); and 33 denotes a spectrum analyzer.

As mentioned above, when signals are injected into the upper and lower sidebands and the ratio of input signal intensities ($P_{in.USB}/P_{in.LSB}$) and the ratio of output signal intensities ($P_{out.USB}/P_{out.LSB}$) can be determined, the sideband ratio (SBR) can be obtained. Whereas it is relatively easy to accurately obtain the ratio of output signal intensities ($P_{out.USB}/P_{out.LSB}$) it is difficult to accurately obtain the ratio of input signal intensities ($P_{in.USB}/P_{in.LSB}$). Consequently, it is difficult to measure the sideband ratio (SBR).

To solve the above problem, the present invention provides a method for determining the sideband ratio. The principle of the method will now be described hereinbelow.

Figure 2:
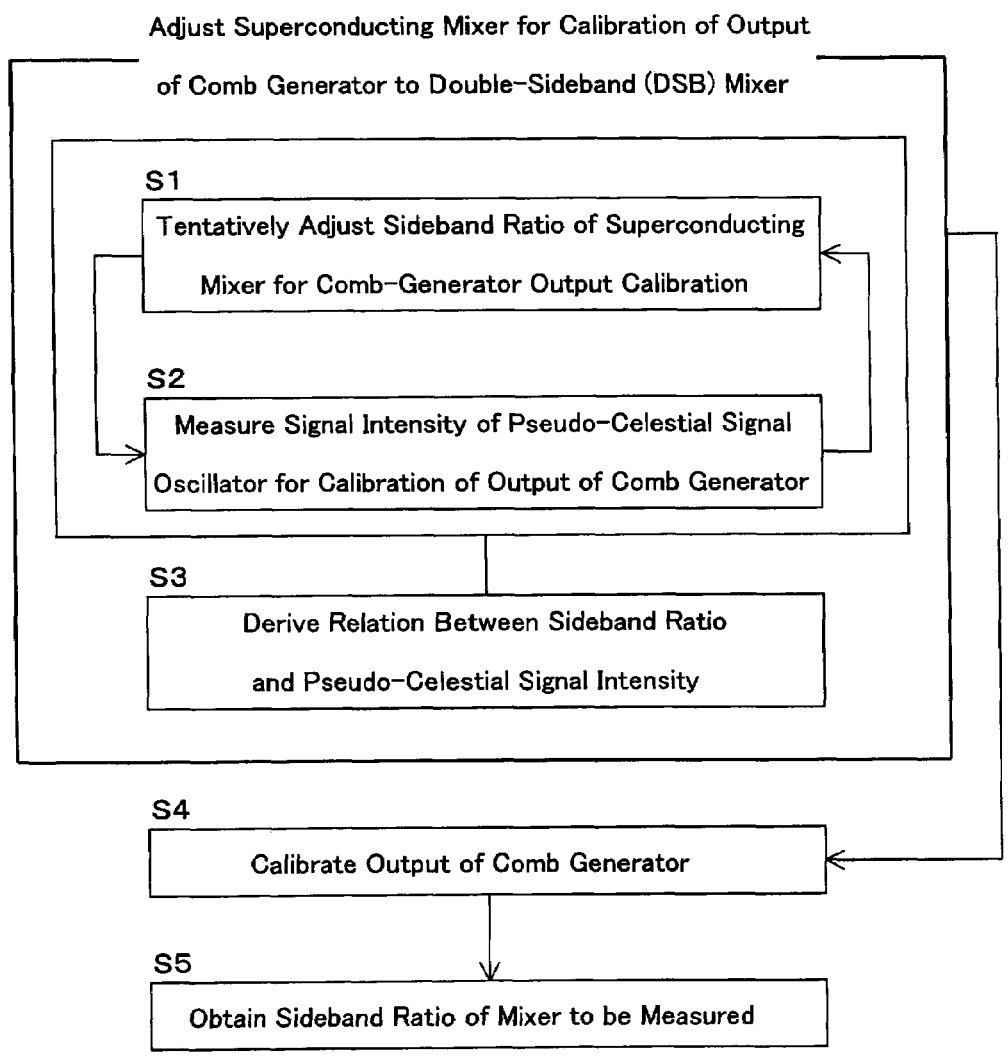
FIG. 2 is a flowchart, explaining the embodiment of the present invention, of a sideband-ratio obtaining procedure for determining the sideband ratio (SBR) of the superconducting (SIS) mixer using the comb generator.

FIG. 2 is a flowchart, explaining the embodiment of the present invention, of a sideband-ratio obtaining procedure for determining the sideband ratio (SBR) of a superconducting (SIS) mixer using a comb generator. FIG. 3 includes graphs showing measurements of the sideband ratios. FIG. 3(a) shows the measurements of a DSB (double-sideband) receiver (the right portion denotes the upper sideband). FIG. 3(b) shows the measurements of an SSB (single-sideband) receiver. The abscissa indicates the intermediate frequency (IF) and the ordinate indicates the IF output intensity. FIG. 4 is a graph showing the relation between a tentative SBR, obtained through the comb generator when the back short of the superconducting (SIS) mixer for calibration of the output of the comb generator is changed, and the intensity of a pseudo-celestial signal. Referring to FIG. 4, a DSB point (true SBR=point at 0 dB) is obtained on the basis of a measurement (ordinate) of the pseudo-celestial signal and the tentative SBR (abscissa) obtained from the signal ratio of the comb generator.

The determination of the sideband ratio according to the present invention will now be described with reference to the above-mentioned diagrams.

(1) The comb generator 23 is capable of generating signals with an arbitrary intensity ratio in the upper and lower sidebands. The back short of the superconducting (SIS) mixer 8 for calibration of the output of the comb generator is adjusted so that the sideband ratio (SBR) can be changed from the DSB state (the right portion denotes the upper sideband) shown in FIG. 3(a) to the SSB state shown in FIG. 3(b).

First, the back short of the superconducting (SIS) mixer 8 for the comb-generator output calibration is adjusted so as to maximize the IF (intermediate frequency) output thereof. The output of the comb generator is adjusted so that the output intensity in the upper sideband is substantially the same as that in the lower sideband. At this time, the output of the comb generator is not calibrated. The output at this time is set to a tentative DSB point (the signal intensity ratio=1=0 dB) (step S1).

(2) In this state, the signal intensity of the pseudo-celestial signal oscillator 25 for calibration of the output of the comb generator is measured using the AOS 32 (step S2).

(3) Subsequently, the state of the comb generator is maintained as is. The back short of the superconducting (SIS) mixer 8 for the comb-generator output calibration is adjusted, thus changing the sideband ratio. The intensity ratio of output signals generated from the mixer for calibration at that time is obtained, thus deriving the amount of change (hereinbelow, referred to as a "tentative sideband ratio") from the tentative DSB point of the sideband ratio (step S1 is repeated).

(4) In this state, the intensity of the pseudo-celestial signal is measured using the AOS 32 in the same way as the above-mentioned (2) (step S2 is repeated).

(5) The above-mentioned (3) and (4) are repeated and the sideband ratio is changed, thus deriving the relation between the tentative sideband ratio of the superconducting (SIS) mixer 8 for the comb-generator output calibration and the pseudo-celestial signal (step S3).

(6) A signal intensity P to be measured is expressed as a function of intensity ($P_{DSB}$) obtained in measurement using a double-sideband mixer versus the sideband ratio (SBR). Generally, $P_{DSB}$ is unknown. Therefore, the resultant value derived by the above-mentioned (5) is subjected to leastsquares approximation, thus obtaining $P_{DSB}$ and the difference between the "tentative sideband ratio" and the "true sideband ratio" (refer to FIG. 4). The superconducting (SIS) mixer 8 for the comb-generator output calibration is adjusted so as to function as a double-sideband (DSB) mixer using the result. Since the mixer is adjusted so as to act as the DSB mixer, the output-signal intensity ratio of the mixer is equivalent to the input-signal intensity ratio thereof. In other words, the output of the comb generator can be calibrated. The comb generator is adjusted so that the output signal ratio of the mixer is set to 1 (step S4).

(7) A signal of the comb generator with the calibrated output is supplied to the superconducting (SIS) mixers 3 to be measured. Thus, the sideband ratio (SBR) of each superconducting (SIS) mixer 3 can be obtained (step S5).

With respect to noise temperature, current-voltage characteristics, and IF band characteristics, the rotary mirror 12, controlled through the computer 31, is rotated, and therefore, the room-temperature load (300 K) 13 and the liquid nitrogen cold load (77 K) 14 can be automatically measured.

According to the present invention, the output of the comb generator is calibrated using a variable sideband mixer with a back short. The setting accuracy of the sideband ratio of the variable sideband mixer has an error of about 1 dB. Since the calibration accuracy of the comb generator is based on the above setting accuracy, the calibration accuracy thereof has a similar error. Accordingly, the measurement error of the sideband ratio of each mixer to be measured is similarly about 1 dB.

The frequency of the comb-generator reference signal oscillator is swept, so that the frequency characteristics of the sideband ratio in a frequency band can be obtained.

The present invention is not limited to the foregoing embodiment, but many modifications are possible within the spirit of the present invention. The modifications are not excluded from the scope of the invention.

As mentioned above, according to the present invention, the following advantages can be produced:

(A) The sideband ratio can be accurately determined, thus detecting millimeter and submillimeter waves in a wider frequency band with high sensitivity.

(B) The ALMA (Atacama Large Millimeter Array millimeter-wave and submillimeter-wave interferometer) requires 80 or more receivers having uniform performance for each band. It is necessary to conduct performance evaluation for the many receivers in a short time. According to the present invention, the millimeter-wave and submillimeter-wave SIS mixers can be evaluated simply and easily.

(C) In order to obtain the sideband ratio with accuracy, generally, receivers are mounted on a telescope to measure the intensity of a celestial body. According to the present invention, the sideband ratio can be simply obtained in a laboratory.

(D) The frequency of the comb-generator reference signal oscillator is swept, so that the frequency characteristics of the sideband ratio in a frequency band can be obtained.

(E) With respect to noise temperatures, current-voltage characteristics, and IF band characteristics, the rotary mirror, controlled through the electronic controller, is rotated to automatically measure the room-temperature load and the cold load. Thus, the temperature can be calibrated.

INDUSTRIAL APPLICABILITY

A method and device for determining the sideband ratio of a superconducting mixer using a comb generator according to the present invention are used in atmospheric science and radio astronomy. The method and device are particularly suitable for determining the sideband ratio of a superconducting (SIS) mixer.

What is claimed is:

1. A method for determining the sideband ratio of a superconducting mixer using a comb generator, the method comprising the steps of:
    (a) tentatively adjusting the sideband ratio of a mixer for calibration of an output of the comb generator;
    (b) determining the signal intensity of a pseudo-celestial signal oscillator for calibration of the output of the comb generator;
    (c) repeating the steps (a) and (b) to derive the relation between the sideband radio of the mixer for the comb-generator output calibration and the intensity of the pseudo-celestial signal;
    (d) calibrating the output of the comb generator; and
    (e) obtaining the sideband ratio of the mixer to be measured.

2. The method according to claim 1, wherein the output of the comb generator is calibrated using a variable sideband mixer with a back short.

3. The method according to claim 1, wherein the frequency of a reference signal oscillator for the comb generator is swept to obtain the frequency characteristics of the sideband ratio in a frequency band.

4. A device for determining the sideband ratio of a superconducting mixer using a comb generator, the device comprising:
    (a) a signal oscillation unit comprising a comb-generator reference signal oscillator, the comb generator, a pseudo-celestial signal oscillator for calibration of an output of the comb generator, and a local oscillator;
    (b) a Dewar vessel having superconducting mixers to be measured and a superconducting mixer for calibration of the output of the comb generator;
    (c) a temperature calibration unit;
    (d) a spectrum analyzer connected to an output section of the Dewar vessel; and
    (e) an electronic controller connected to the signal oscillation unit, the Dewar vessel, the temperature calibration unit, and the spectrum analyzer, wherein
    (f) an output signal of the comb generator is supplied to the Dewar vessel to obtain the sideband ratio of each superconducting mixer to be measured.

5. The device according to claim 4, wherein the comb-generator reference signal oscillator generates a signal with a bandwidth of several GHz.

6. The device according to claim 4, wherein the frequency of the comb-generator reference signal oscillator is swept to obtain the frequency characteristics of the sideband ratio in a frequency band.

7. The device according to claim 4, wherein the temperature calibration unit has a room-temperature load, a cold load, and a rotary mirror controlled by means of the electronic controller.

8. The device according to claim 7, wherein with respect to noise temperature, current-voltage characteristics, and IF band characteristics, the rotary mirror, controlled through the electronic controller, is rotated to automatically measure the room-temperature and cold loads, thus calibrating the temperature.

\* \* \* \* \*